US005886299A

United States Patent [19]

Ward

[11] Patent Number: 5,886,299

[45] Date of Patent: Mar. 23, 1999

[54] INLET VALVE ASSEMBLY FOR CENTRAL VACUUM SYSTEM

[75] Inventor: John Frederick Ward, Midhurst, Canada

[73] Assignee: Canplas Industries, Ltd., Barrie, Canada

[21] Appl. No.: 923,428

[22] Filed: Sep. 4, 1997

Related U.S. Application Data

[63] Continuation of Ser. No. 736,478, Oct. 24, 1996, abandoned, which is a continuation of Ser. No. 251,416, May 31, 1994, Pat. No. 5,578,795, which is a division of Ser. No. 890,208, May 29, 1992, Pat. No. 5,448,827.

[51] Int. Cl.[6] .......... H05K 5/03

[52] U.S. Cl. .......... 174/66; 439/536; 220/241

[58] Field of Search .......... 174/66, 53, 54, 174/55, 56, 50; 439/191, 192, 193, 194, 536; 220/3.8, 241

[56] References Cited

U.S. PATENT DOCUMENTS

| | | | |
|---|---|---|---|
| 871,364 | 11/1907 | Schmidt . | |
| 1,099,680 | 6/1914 | Weirich . | |
| 1,875,224 | 8/1932 | Despard . | |
| 2,174,811 | 10/1939 | White . | |
| 2,248,201 | 7/1941 | Russell et al. . | |
| 2,806,941 | 9/1957 | Graziani . | |
| 3,034,085 | 5/1962 | Pauler et al. . | |
| 3,036,170 | 5/1962 | Forney . | |
| 3,076,068 | 1/1963 | Racklyeft . | |
| 3,127,227 | 3/1964 | Edwards . | |
| 3,173,164 | 3/1965 | Congdon . | |
| 3,195,095 | 7/1965 | Field . | |
| 3,258,553 | 6/1966 | Breslin . | |
| 3,283,093 | 11/1966 | Bishop . | |
| 3,291,927 | 12/1966 | Riley, Jr. et al. . | |
| 3,314,039 | 4/1967 | Opper . | |
| 3,335,744 | 8/1967 | Hanford . | |
| 3,341,944 | 9/1967 | Ligon . | |
| 3,465,111 | 9/1969 | Breslin . | |
| 3,470,521 | 9/1969 | Downey . | |
| 3,483,503 | 12/1969 | Paradiso . | |
| 3,565,103 | 2/1971 | Maselek . | |
| 3,661,356 | 5/1972 | Tucker . | |
| 3,812,444 | 5/1974 | Reno . | |
| 3,895,732 | 7/1975 | Robinson et al. . | |
| 4,036,389 | 7/1977 | Pate et al. . | |
| 4,059,327 | 11/1977 | Vann . | |
| 4,211,457 | 7/1980 | Meadows . | |
| 4,261,633 | 4/1981 | Abernethy | 439/536 X |
| 4,336,427 | 6/1982 | Lindsay . | |
| 4,402,516 | 9/1983 | Gans et al. . | |
| 4,473,923 | 10/1984 | Neroni et al. . | |
| 4,477,141 | 10/1984 | Hardesty | 439/536 X |

(List continued on next page.)

FOREIGN PATENT DOCUMENTS

| | | | |
|---|---|---|---|
| 1268795 | 5/1990 | Canada . | |
| 1267174 | 12/1990 | Canada . | |
| 8904561 | 5/1989 | WIPO | 174/53 X |

OTHER PUBLICATIONS

MetFlo Brochure H.P. Products Inc. 1988 Part No. 1200.
Distributor Price List, H–P Products Inc., Mar. 18, 1985.

*Primary Examiner*—Dean A. Reichard

[57] ABSTRACT

This invention relates to an inlet valve assembly for central vacuum systems. In particular, this invention relates to an inlet valve assembly including an inlet face plate, a mounting plate, having a deformable mounting flange, and an electrical receptacle integrally formed with a high voltage wire. In some uses, the inlet valve assembly also can include a low voltage wire which can be used to complete a low voltage circuit to initiate a central vacuum motor. The mounting plate can accommodate the electrical receptacle in a temporary position and the inlet face plate can rear mount the receptacle into a locked position where the receptacle is securely attached to the inlet face plate. In this manner, the receptacle may be mounted to the inlet face plate even though one end of the high voltage wire is already wired into an electrical box.

10 Claims, 4 Drawing Sheets

U.S. PATENT DOCUMENTS

| | | | |
|---|---|---|---|
| 4,494,815 | 1/1985 | Brzostek et al. | 439/536 |
| 4,525,918 | 7/1985 | Puritz . | |
| 4,550,958 | 11/1985 | Smith . | |
| 4,602,504 | 7/1986 | Barber . | |
| 4,618,195 | 10/1986 | Keane . | |
| 4,639,055 | 1/1987 | Keane . | |
| 4,652,063 | 3/1987 | Genoa et al. . | |
| 4,664,457 | 5/1987 | Suchy . | |
| 4,732,397 | 3/1988 | Gavin . | |
| 4,735,579 | 4/1988 | Muser . | |
| 4,758,170 | 7/1988 | Hayden | 439/191 X |
| 4,815,747 | 3/1989 | Wolford . | |
| 4,840,574 | 6/1989 | Mills . | |
| 4,895,528 | 1/1990 | Choiniere et al. . | |
| 4,902,043 | 2/1990 | Zillig et al. . | |
| 4,915,640 | 4/1990 | Hayden . | |
| 4,920,456 | 4/1990 | Pirdzuns . | |
| 4,990,094 | 2/1991 | Chandler et al. . | |
| 5,263,502 | 11/1993 | Dick . | |
| 5,349,146 | 9/1994 | Radabaugh | 439/191 X |
| 5,507,501 | 4/1996 | Palmer . | |
| 5,578,795 | 11/1996 | Ward . | |

INLET VALVE ASSEMBLY FOR CENTRAL VACUUM SYSTEM

This is a continuation of application Ser. No. 08/736,478 now abandoned, filed Oct. 24, 1996, which is a continuation of Ser. No. 08/251,416, filed May 31, 1994, now U.S. Pat. No. 5,578,795, which is a division of application Ser. No. 07/890,208, filed May 29, 1992, now U.S. Pat. No. 5,448, 827.

FIELD OF THE INVENTION

This invention relates to inlet valve assemblies of the type that are used to provide a handy wall receptacle for access to central vacuum cleaning systems. In particular, this invention relates to an inlet valve assembly of the type that contains both high voltage and low voltage wiring connections.

BACKGROUND OF THE INVENTION

Central vacuum cleaning systems are becoming more common in residential housing. Essentially, a central vacuum cleaning system comprises a vacuum pump, located in a remote location in a residential unit, such as in the basement or in the garage, together with plastic piping which extends beneath the floor and between the walls to various locations within the residential unit. At the terminus of the vacuum piping is located an inlet valve assembly. The inlet valve assembly allows a person desiring to use the central vacuum system to attach a hose-cuff on a portable vacuum hose to the vacuum system.

In the past, inlet valve assemblies have been formed with low voltage electrical contacts. Typically a flexible hose, with a vacuum-head attached, is connected to the inlet valve assembly. Most typically, the hose-cuff includes an electrical contact-plate which completes a low voltage electrical circuit either automatically or through a manual switch to cause the vacuum motor to be turned on when the hose-cuff is placed in the inlet valve assembly.

More recently, home owners have indicated a preference for power-head attachments to facilitate effective vacuuming and cleaning. A power-head requires a high voltage circuit and is typically accessed by means of an extension cord which extends between the power head and the nearest adjacent electrical wall receptacle. However, this is inconvenient and awkward since the extension cord may extend a different length and in a different direction than the vacuum hose connected to the inlet valve assembly.

Most recently, attempts have been made to develop an inlet valve assembly which includes a high voltage electrical receptacle as part of the assembly. In this manner power and suction can be delivered to the power head through an integral hose and power cord. In particular, Hayden, in Canadian Patent No. 1,267,174 proposes a current carrying inlet valve for a central vacuum system. However, this prior device has several disadvantages. Firstly, this prior inlet valve assembly includes an inlet face plate, a mounting plate, and a wiring compartment. The wiring compartment must be specially formed to avoid interfering with the vacuum tubing. Manual access to the wiring compartment can be awkward.

A greater disadvantage of this device however relates to its installation. In a typical new home installation, an electrician would rough in the wiring, including roughly locating electrical junction boxes and electrical receptacle boxes in positions on various studs. Then, central vacuum installers would arrive, and install the vacuum piping with an appropriate mounting plate to locate the ends of the piping adjacent or near the roughed in electrical receptacles. Then, the electrician would return and extend wires from electrical receptacles into the electrical wiring compartment associated with this prior device. Then, the dry waller would drywall over the studs leaving appropriate openings for the electrical receptacle box and for the mounting plate for the central vacuum system. Then, the electricians have to return again to wire a high voltage electrical receptacle into the wiring compartment associated with the vacuum valve assembly. Such multiple attendances by an electrician is both wasteful and expensive.

BRIEF SUMMARY OF THE INVENTION

What is required is a simple, easy to use, inexpensive, and efficient inlet valve assembly for use in association with central vacuum cleaning systems. Preferably such an assembly should include a low voltage and a high voltage circuit, mounted directly within the inlet valve assembly, but should be configured in such a way that three visits of the electrician are not required.

According to one aspect of the present invention there is disclosed an inlet face plate for use in association with a central vacuum cleaning system, said inlet face plate comprising:

a main body having a front facing portion and a rear facing portion;

a vacuum opening in said main body to receive a hose-cuff;

an electrical receptacle opening in said front face of said main body; and an electrical receptacle mounting means associated with said electrical receptacle opening adapted to rear mount an electrical receptacle.

According to another aspect of the present invention there is disclosed an electrical receptacle for use in association with an inlet face plate as described above, said electrical receptacle having a front face with electrical prong openings, said front face generally registering with said electrical receptacle opening and a shoulder at least partially around said front face said shoulder contacting at least one portion of the rear facing portion of said inlet face plate.

In a further aspect of the present invention, there is provided a mounting plate for use in association with an inlet face plate in a central vacuum cleaning system, the mounting plate comprising:

at least four marking posts on a front face;

at least two mounting posts to mount a deformable flange; and, at least one cleat to cause said deformable flange to deform along a preferred line of deformation.

According to a further aspect of the present invention there is provided a method of installing an inlet valve assembly for a central vacuum system, said inlet valve assembly including an inlet face plate, a mounting plate, a high voltage wire with a receptacle head end and a free end, and a low voltage wire, said method comprising:

a) locating said mounting plate adjacent to an electrical box;

b) wiring said free end of said high voltage wire into said electrical box; and then c) securing said head end of said high voltage wire to said inlet face plate.

BRIEF DESCRIPTION OF THE FIGURES

Reference will now be made to a preferred embodiment of the invent-ion by way of example only by reference to the following figures in which.

DETAILED DESCRIPTION OF PREFERRED EMBODIMENT

Figures 1, 2:
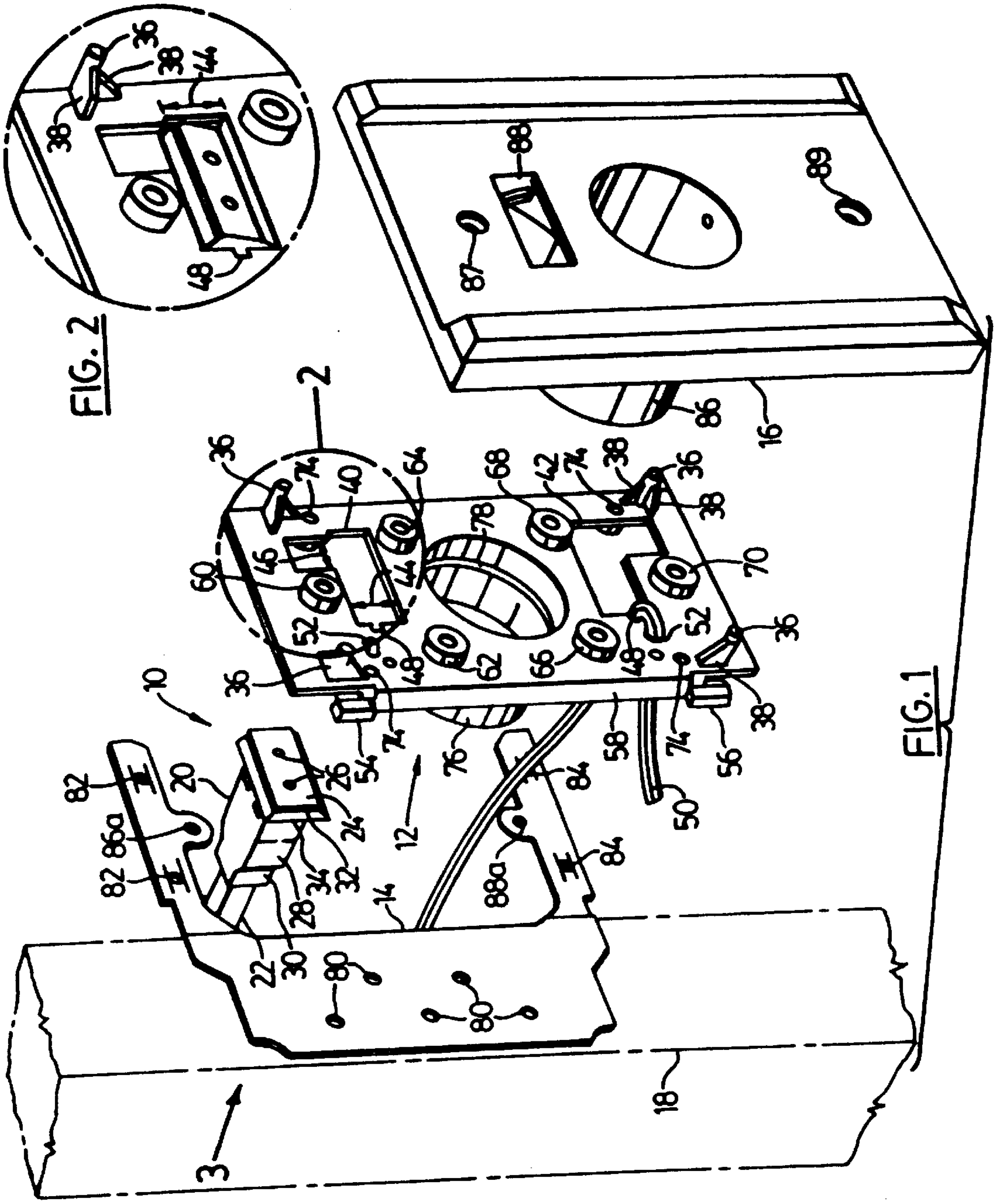
FIG. 1 is an exploded front perspective view of an valve assembly according to the present invention.
FIG. 2 is a close-up view of a portion of FIG. 1, showing a receptacle partially inserted through an opening.

FIG. 1 shows an inlet valve assembly according to the present invention in an exploded perspective view with the main constituent elements including a high voltage electrical receptacle 10, a mounting plate 12 with an associated deformable mounting flange 14 and an inlet face plate 16. Also shown in FIG. 1 in ghost outline is a stud 18.

The high voltage electrical receptacle 10 is comprised of a head 20 which is preferably molded directly on to 14 gauge wire (for North American construction) 22. The head 20 includes a front face 24 having a pair of pin receptacle holes 26 and a main body 28. The main body 28 includes a tapered rear portion 30.

The front face 24 is defined by side walls 32 which end at tapered shoulders 34. The purpose of the side walls 32 and the tapered shoulders 34 is explained in more detail below.

The mounting plate 12 includes a number of different features. In particular, the mounting plate 12 includes four marking posts 36 having reinforcing flanges 38. Additionally, the mounting plate 12 has upper and lower L-shaped openings 40 and 42 respectively. It is preferred if the width shown as 44 is slightly greater than the width shown as 46 as will be explained below. Also shown is a notch 48 formed in one end of each L-shaped opening 40, 42.

Referring to FIG. 2, the high voltage electrical receptacle 10 can be seen being passed through an upper L-shaped opening 40. It can now be appreciated that the width 44 is sufficient to allow the tapered shoulders 34 of the high voltage electrical receptacle 10 to pass through the upper L-shaped opening 40. The lover L-shaped opening is similarly dimensioned. While not essential, such dimensioning is preferred to ensure flexibility in installation.

Also shown in FIG. 1 is a low voltage wire 50 which has been looped through notch 48 and passed through a strain relief opening 52. The purpose of the notch 48 and the strain relief opening 52 is to allow the low voltage wire 50 to be temporarily secured to the mounting plate 12 prior to being wired into the inlet face plate 16. The temporary storage position is illustrated in FIG. 1. It will be appreciated that in some applications the low voltage wire 50 may not be necessary. However, for universality of the mounting plate 12, the strain relief opening 52 is provided.

Figure 3:
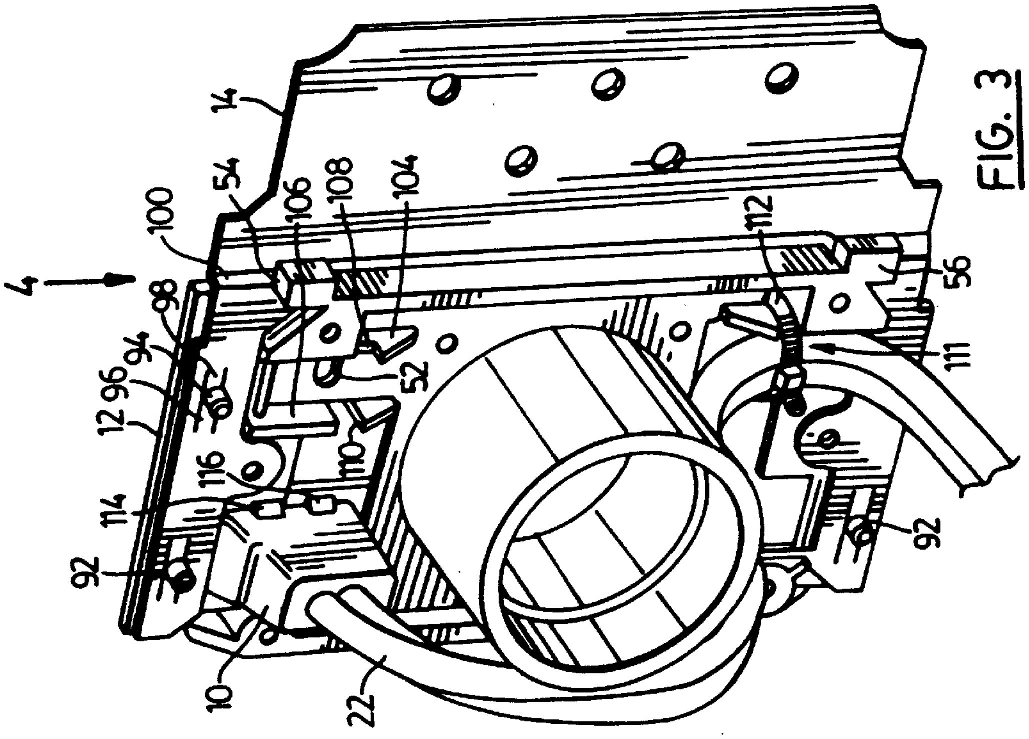
FIG. 3 is a rear view of a mounting plate with a deformable flange mounted thereon.

Also shown in FIG. 1 are an upper cleat 54 and a lower cleat 56. Running between upper cleat 54 and lower cleat 56 is a reinforcing flange 58. A similar flange 58 is located on the far side of mounting plate 12, although there are no cleats 54, 56, as shown in FIG. 3.

Also shown in FIG. 1 are raised mounting holes 60, 62, 64, 66, 68 and 70. It will be appreciated by those skilled in the art that six mounting holes are not required, although with the configuration illustrated in FIG. 1, the mounting holes 62 to 70 are capable of accommodating a number of different inlet face plates having different mounting configurations. In this manner the mounting plate 12 may be used with most of the commercially available inlet face plates currently on the market.

Also shown in FIG. 1 are a number of other holes 74 which again are used to mount the mounting plates to different inlet face plates.

The mounting plate 12 also includes a rearwardly extending connector pipe 76 for connection to a vacuum pipe. Mounted within the rearwardly extending connector pipe 76 is a deformable seal 78. Preferably the deformable seal 78 is in the form of a rubber flange.

As shown in FIG. 1, the deformable mounting flange 14 is located closely adjacent to the stud 18. Nails, screws or other suitable fastening devices could be inserted through fastening holes 80 for the purpose of securing the deformable mounting flange to the stud 18. The deformable mounting flange also includes upper gripping openings 82 and a lower gripping openings 84. Mounting holes **86*a* and 88*a* in the deformable mounting flange 14 correspond to mounting holes 60 and 70 respectively in the mounting plate 12**.

Also shown in FIG. 1 is an inlet face plate or cover plate 16. The cover plate 16 includes a rearwardly extending connector pipe 86 which may be inserted into rearwardly extending connector pipe 76 and sealed against deformable seal 78. The inlet face plate 16 also includes upper and lower securing holes 87, 99 which register with corresponding holes 60, 70 on the mounting plate 12 and the holes **86*a*, 88*a* of the deformable mounting flange 14**.

Also shown in FIG. 1 is a receptacle opening 88 formed in the inlet face plate 16.

Turning to FIG. 3, further details of the assembly can now be understood. FIG. 3 shows the mounting plate 12 with the deformable mounting flange 14 mounted thereon. Further, mounted in the mounting plate 12 is the high voltage electrical receptacle 10.

Figure 4:
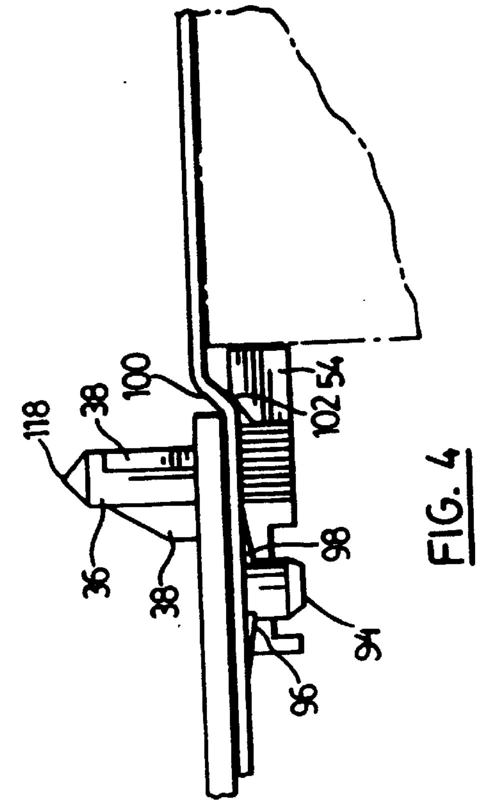
FIG. 4 is a top view showing the mounting of the deformable flange and an associated stud in ghost outline.

With reference to mounting flange 14, as can be seen in FIG. 3, the upper gripping openings 82 and the lower gripping openings 84 are mounted onto gripping posts 92 and 94 respectively. As can be seen in FIG. 4, the deformable mounting flange 14 includes a pair of tongues 96 and 98 which substantially define the upper and lower gripping openings 82, 84. The tongues 96 and 98 form an opening which is slightly smaller in diameter than the outer diameter of upper and lower gripping posts 92 and 94. in this manner, when the deformable mounting flange 14 is pushed onto the upper and lower gripping posts 92, 94 the tongues 96, 98 deform slightly outwardly. Thereafter the tongues inhibit backward movement of the deformable mounting flange 14 off the upper and lower gripping posts 92, 94. This gripping action can further be enhanced by forming the deformable mounting flange 14 with relatively sharp edges at the ends of tongues 96, 98.

In the preferred embodiment, the deformable mounting flange is formed from a suitable malleable material, such as sheet metal. In this manner, the mounting flange can be easily attached to a stud 18 and non-elastically deformed or bent to a desired position for the remainder of the construction. The deformable mounting flange allows for accurate positioning even where the stud 18 may be warped or bent.

The function of upper cleat 54 and the lower cleat 56 can now be understood. It will be seen that the deformable mounting flange 14 is preferably formed with an off-set 100. The off-set 100 fits behind the upper and lower cleats 54, 56 in close engagement. In this manner, the upper and lower cleats 54, 56 define an axis of deformable bending at the contact point 102 with the deformable flange 14. In the absence of these cleats 54, 56 it has been found that the deformable mounting flange 14 tends to bend adjacent to the gripping post 94 shown in FIG. 4. This is undesirable since such bending tends to weaken the grip of the tongues 96 and 98 onto the gripping posts 92 and 94 and may lead to a failure.

Turning back to FIG. 3, it can be seen that there are a pair of parallel low walls 104 and 106. Between the parallel low walls 104 and 106 is located the strain relief opening 52. Formed in the low walls 104 and 106 are a pair of corresponding notches 108 and 110. As shown at the bottom of FIG. 3, as generally indicated at 111 the purpose of the notches 108 and 110 and the parallel walls 104 and 106 is to form a strain relief connection to secure the 12 gauge wire 22 in position. In the absence of such a strain relief connection, preferably formed by a gripping member or a strap shown at 112, there is a risk that tugging on the wire 22, such as may occur during construction, could cause a breakage in the electrical connection between the wire 22 and the electrical receptacle 10. The use of a gripping member 112 to provide a strain relief connection as shown in FIG. 3 prevents this from occurring.

Also from FIG. 3, it can be seen that the high voltage electrical receptacle has been passed from back to front through the mounting plate 12, as illustrated in FIG. 2, and is temporarily secured in an upright position in part of the L-shaped opening 40. In FIG. 3 a pair of detents 114 and 116 are shown. Complementary detents would be formed on the opposite side of the high voltage electrical receptacle 10. The purpose of the detents 114 and 116 are to secure the high voltage electrical receptacle 10 in position in L-shaped openings 40, 42.

Some of the features and advantages of the present application can now be understood.

In a typical home construction, after the stud walls are formed, an electrician will attend to the construction site and install appropriate electrical boxes. Then, the duct work is installed and after that, the central vacuum cleaner installers can attend the construction site. The first step is to insert the deformable mounting flange 14 onto the back of a mounting plate 12. Then the electrical receptacle 10 can be inserted into the L-shaped opening 40, strain-relieved as shown at 111, and be provided with a pigtail wire 22 of about 45 inches in length (slightly more than two conventional stud widths). Then, the mountings flange 14 can be nailed onto the face of a stud 18 through the openings 80. The location of the mounting plate can be done with reference to the roughed in electrical boxes. In other words, the mounting plate 14 will be nailed into a stud 18 in such a manner that the end of the wire 22 remote from the head 20 can be wired into the electrical box. It will be appreciated that the assembly of mounting flange 14 and mounting plate 12 is reversible, to allow it to be mounted in a left or right-hand fashion as required to locate it near to the electrical box. Thereafter, holes may be drilled by the vacuum installer in the studs, if wooden, and the high voltage wire 22 threaded back to the electrical box.

Then, a drywaller can attend the site and complete the drywall installation. For the purpose of allowing an easy installation around the mounting plate 12, the drywaller can temporarily put drywall in position, and press the drywall against the marking posts 36. As shown in FIG. 4, it is preferable if the mounting posts 36 have a peak or pointed end 118 to make a good mark.

The four marking posts will define an opening which the drywall installer can easily form in the drywall sheets to be mounted on the wall. The opening in the drywall permits access to the mounting plate.

Once the drywall is installed, the electrician can return to wire in the electrical outlets and switches. At this stage, the electrician can also wire in the electrical wires 22 from the central vacuum system into the appropriate adjacent electrical boxes. Once this wiring step is completed, the electrician need not return for the purpose of completing any further wiring for the vacuum system. Thus, the electrician need only make two visits rather than three as required when using the valve assembly taught by in the prior art.

Figure 5:
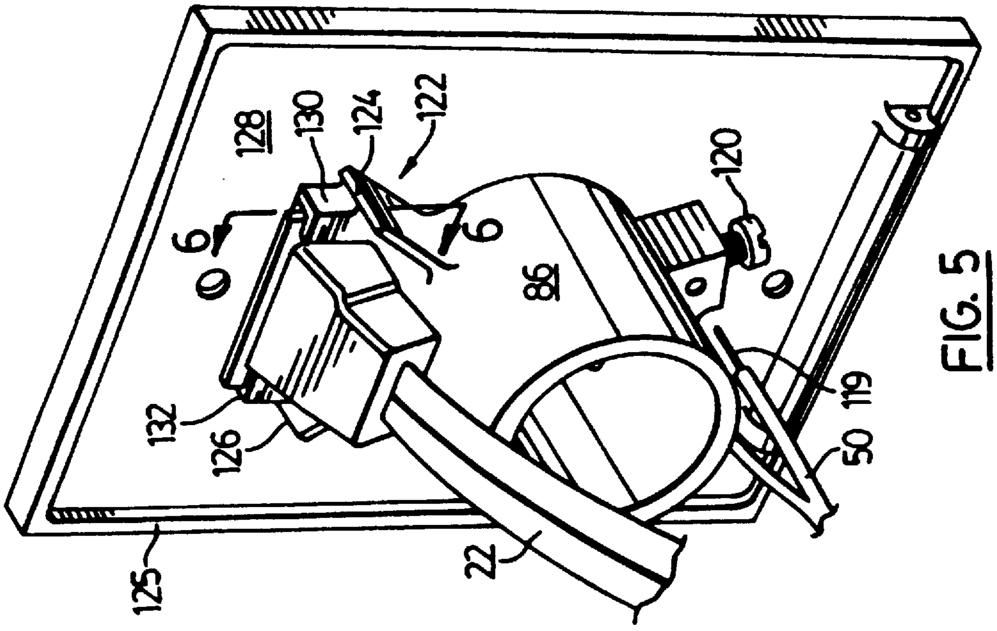
FIG. 5 is a rear view of a receptacle being mounted in a rear mounting means on an inlet face plate.

Turning now to FIG. 5, it can be understood how the high voltage electrical receptacle 10 is mounted to the inlet face plate 16. As shown in FIG. 5, the low voltage wire 50 can be pulled out of the position shown in FIG. 1, the wire stripped as shown at 119, and the electrical connection made in screw connectors 120. On the opposite side of the rearwardly extending connector pipe 86, is formed a rear mounting means 122. It will be appreciated that at this point of the installation procedure, the other end of wire 22 remote from high voltage electrical receptacle 10 is securely wired into an electrical receptacle by an approved or licensed electrician. Therefore, there is no opportunity to slide the electrical receptacle 10 through the front face of the inlet face plate 16 since there is no free end of the wire 22. If such a free end were available, a further visit from an electrician would be required at additional expense and delay.

As shown in FIG. 5, a pair of support flanges 124 and 126 are formed extending outwardly between a rear face 128 of the inlet face plate 16 and the rearwardly extending connector pipe 86. Preferably the flanges 124 and 126 are of a height which allows the flange to come in contact with the mounting plate 12 at the point where the inlet face plate 16 is in contact with the wallboard around its rear perimeter 125, and is fully sealed in rearwardly extending connector pipe 76 on the mounting plate.

Figure 6:
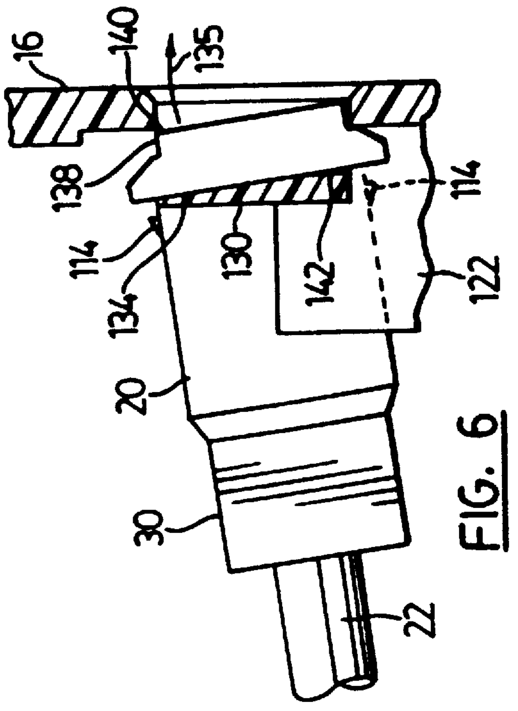
FIG. 6 shows a cross-sectional view taken along lines 6—6 of FIG. 5 with an electrical receptacle in an almost inserted position.
Figure 7:
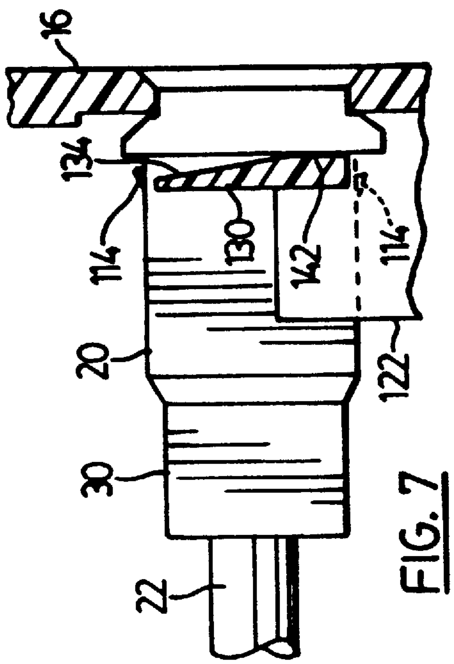
FIG. 7 shows a view along lines 6—6 of FIG. 5 with an electrical receptacle in a fully inserted position.

As shown in FIG. 5, all that is required to complete the assembly once the low voltage electrical wires 50 are installed into the low voltage electrical contacts, is to secure the high voltage electrical receptacle 10 into the rear mounting means 122. The rear mounting means 122 comprises a pair of side guides 130 and 132. Each side guide 130 and 132 includes a sloped surface 134 as shown in FIGS. 6 and 7. The rear of the tapered shoulder 34 is caught under the side guides 130 and 132 and slides down the sloped surface 134. The tapered shoulder 34 at the bottom allows rotation in the direction of arrow 135, of the receptacle 10 into position into the receptacle opening 88. As shown in FIG. 6, it is preferably necessary to deform side guides 132 and 130 slightly in order that the corner shown as 138 clears an edge 140 of the mounting opening 88. In this manner, the high voltage electrical receptacle 10 snaps into the opening 88 and by reason of the snap-in fit will be less likely to be accidentally dislodged by a user of the vacuum system. A snug fit around the perimeter, or side walls 32, is provided and the receptacle 10 is supported from the rear by rear surface 142. In this manner, the electrical receptacle 10 is snugly held in place and will withstand many insertions and withdrawals of corresponding electrical pins into the pin receptacle holes 26.

In the fully installed position, a hose-cuff shown as 150 can be inserted with the vacuum connection and the electrical connection being made. The electrical connection can be used to power a power head beater or the like as desired.

Figure 8:
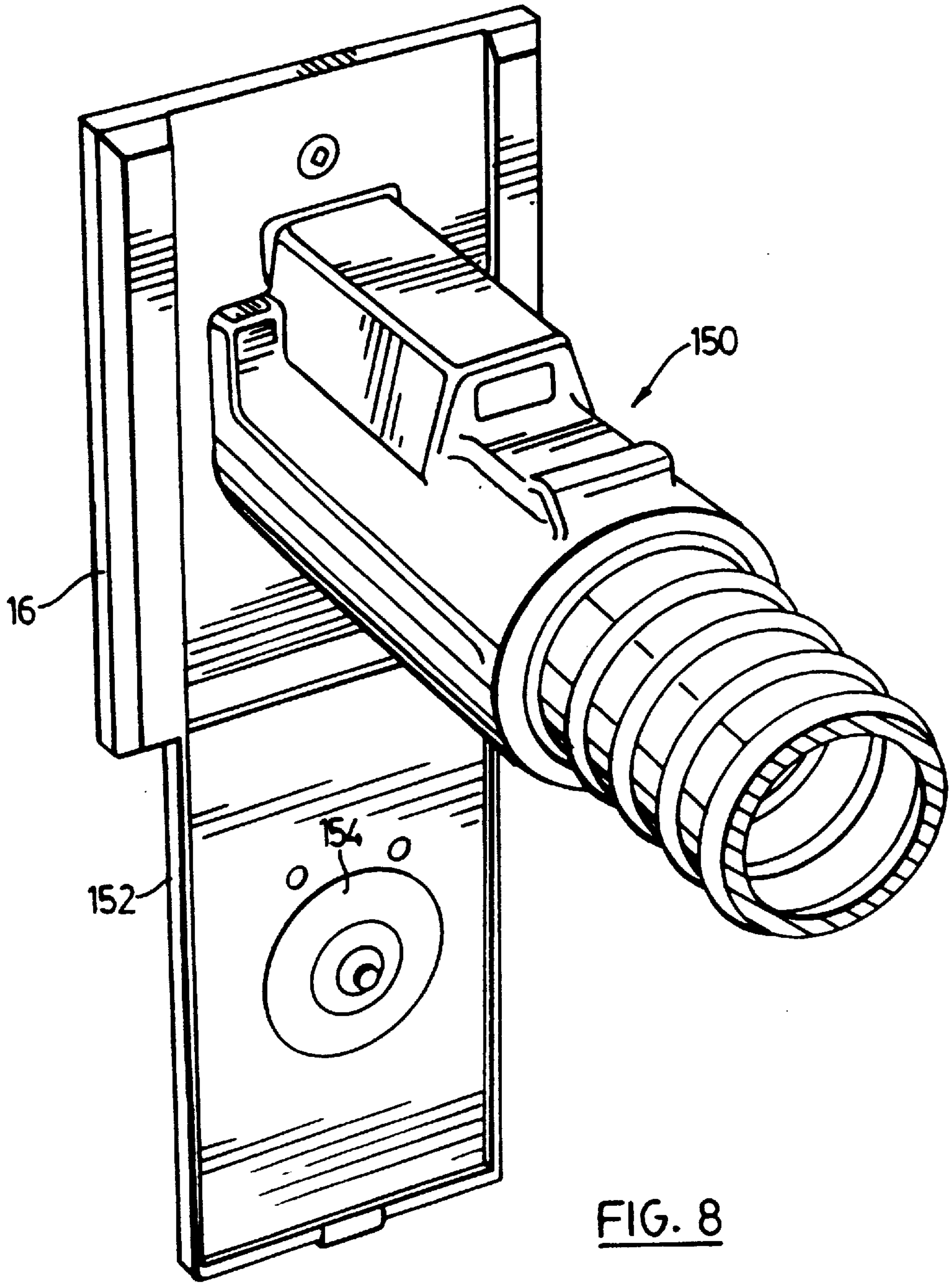
FIG. 8 shows a front view of an inlet face plate with an associated hose-cuff inserted therein.

As shown in FIG. 8, there may also be provided a hinged cover 152 having a vacuum seal 154 to seal around the opening into which the vacuum connection is made in the inlet face plate 16.

It will now be apparent that to achieve the savings of labour for installation, it is necessary that the high voltage electrical receptacle 10 be mountable into the inlet face plate 16, while one end of the wire 22 is wired into a junction box. In the preferred embodiment described above, this is accomplished by rear mounting the receptacle 10 onto the face plate 16. Other rear mounting means may also be possible, such as forming a two piece inlet face plate, with a hole large enough that the receptacle 10 may be passed therethrough, and which may be locked in place with a guillotine plate or the like with a separate fastener to secure the guillotine plate to the inlet face plate. In this context however, rear-mounted denotes that the receptacle 10 is passed from the rear and then into locking contact with the inlet face plate, whether or not the receptacle is secured to a front, middle, or rear face of the inlet face plate 16, itself.

It will be appreciated that the foregoing description relates to preferred embodiments of the invention and that various alterations or variations are possible within the broad scope of the appended claims. Some of these variations have been suggested above and others will be apparent to those skilled in the art.

I claim:

1. An inlet face plate for use in association with a central vacuum cleaning system to provide resealable access to said system, said inlet face plate comprising:

a main body having a front facing portion and a rear facing portion;

a vacuum opening in said main body sized and shaped to receive a hose cuff;

a cover member removably covering said vacuum opening to seal said opening when not in use;

an electrical receptacle opening in said front facing portion of said main body, and extending through to said rear facing portion of said main body said electrical receptacle opening having an associated electrical receptacle mounting means; and an electrical receptacle having a front face with electrical prong openings, wherein said front face is sized and shaped to register with said rearwardly facing electrical receptacle opening, said electrical receptacle being sized and shaped to snap fit into rear mounting engagement with said electrical receptacle mounting means, said electrical receptacle further including an integrally attached trailing wire, wherein said electrical receptacle is rear mountable to said main body when said trailing wire at an end remote from said electrical receptacle is not free.

2. An inlet face plate as claimed in claim 1 wherein said electrical receptacle mounting means comprises at least one cam surface to guide said electrical receptacle into position in said electrical receptacle opening.

3. An inlet face plate as claimed in claim 2 wherein said electrical receptacle mounting means comprises two cam surfaces generally disposed on opposite sides of said electrical receptacle opening.

4. An inlet face plate as claimed in claim 3 wherein said cam surfaces are resiliently displaceable by said electrical receptacle being urged past said cam surfaces into said electrical receptacle opening, but once said electrical receptacle is in position said cam surfaces return to a normal position to assist in retaining said electrical receptacle firmly in position in said electrical receptacle opening.

5. An inlet face plate as claimed in claim 1 wherein said electrical receptacle includes a shoulder at least partially around said front face sized and shaped to snap fit into said mounting means, said shoulder contacting at least one portion of a rear facing portion of said inlet face plate, to prevent removal of said electrical receptacle outwardly through said electrical receptacle opening past said front facing portion of said inlet face plate.

6. An inlet face plate as claimed in claim 5 wherein said electrical receptacle further includes at least one engaging surface to engage at least one cam surface on said electrical receptacle mounting means of said inlet face plate.

7. An inlet face plate for use in association with a central vacuum cleaning system to provide resealable access to said system, said inlet face plate comprising:

a main body having a front facing portion and a rear facing portion;

a vacuum opening in said main bodv sized and shaped to receive a hose cuff;

a cover member removably covering said vacuum opening to seal said opening when not in use;

an electrical receptacle opening in said front facing portion of said main body, and extending through to said rear facing portion of said main body, said electrical receptacle opening having at least one deformable cam; and an electrical receptacle having a front face with electrical prong openings, wherein said front face is sized and shaped to register with said rearwardly facing electrical receptacle opening and to be guided and held in position in said electrical receptacle opening by said deformable cam, said electrical receptacle being sized and shaped to snap fit into rear mounting engagement with said inlet face plate, said electrical receptacle further including an integrally attached trailing wire, wherein said electrical receptacle is rear mountable to said main body when said trailing wire at an end remote from said electrical receptacle is not free.

8. An inlet face plate as claimed in claim 7 wherein said electrical receptacle includes a front face with electrical prong openings and wherein said front face is sized and shaped to register with said electrical receptacle opening, and said electrical receptacle includes a shoulder at least partially around said front face sized and shaped to snap fit into said deformable cam, said shoulder contacting at least one portion of a rear facing portion of said inlet face plate, to prevent removal of said electrical receptacle outwardly through said electrical receptacle opening past said front facing portion of said inlet face plate.

9. An inlet face plate as claimed in claim 8 wherein said shoulder further includes at least one engaging surface to engage said at least one deformable cam on said inlet face plate.

10. An inlet face plate as claimed in claim 8 wherein said at least one deformable cam comprises a pair of deformable cams mounted on opposite sides of said electrical receptacle opening, and wherein said electrical receptacle includes opposed shoulders sized and shaped to be guided and retained by said opposed deformable cams.

* * * * *